US008877298B2

(12) United States Patent
Yuen et al.

(10) Patent No.: US 8,877,298 B2
(45) Date of Patent: Nov. 4, 2014

(54) PRINTING USING A STRUCTURE COATED WITH ULTRAVIOLET RADIATION RESPONSIVE MATERIAL

(75) Inventors: Matthew Ming Fai Yuen, Hong Kong (CN); Edward King Long Chan, Hong Kong (CN); Cheng Yang, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 1424 days.

(21) Appl. No.: 12/453,811

(22) Filed: May 22, 2009

(65) Prior Publication Data

US 2009/0294153 A1    Dec. 3, 2009

Related U.S. Application Data

(60) Provisional application No. 61/071,923, filed on May 27, 2008.

(51) Int. Cl.

| C08J 7/12 | (2006.01) |
| C08J 7/18 | (2006.01) |
| B05D 3/06 | (2006.01) |
| B05D 5/12 | (2006.01) |
| G03F 7/00 | (2006.01) |
| G03F 7/16 | (2006.01) |
| B82Y 10/00 | (2011.01) |
| B82Y 40/00 | (2011.01) |
| H05K 3/20 | (2006.01) |
| B41M 3/00 | (2006.01) |
| H05K 3/12 | (2006.01) |

(52) U.S. Cl.
CPC ...... *G03F 7/0002* (2013.01); *H05K 2203/0104* (2013.01); *G03F 7/161* (2013.01); *H05K 2203/0537* (2013.01); *B41M 3/00* (2013.01); *B82Y 10/00* (2013.01); *B82Y 40/00* (2013.01); *H05K 3/1275* (2013.01); *H05K 3/207* (2013.01); *H05K 2203/0108* (2013.01); *H05K 2203/0534* (2013.01)

USPC ........... 427/510; 427/511; 427/512; 427/98.4

(58) Field of Classification Search
None
See application file for complete search history.

(56) References Cited

U.S. PATENT DOCUMENTS 3,910,187 A * 10/1975 Cords ........................ 101/450.1
5,738,970 A *  4/1998 Hsieh et al. ................... 430/259
5,766,819 A *  6/1998 Blanchet-Fincher ......... 430/201

(Continued)

OTHER PUBLICATIONS

R.J. Lewis, Sr., editor; Hawley's Condensed Chemical Dictionary; 12th edition; Van Nostrand Reinhold Company, New York; 1993 (no month), excerpt p. 109 & 133.*

(Continued)

*Primary Examiner* — Marianne L Padgett
(74) *Attorney, Agent, or Firm* — Nath, Goldberg & Meyer; Jerald L. Meyer; Stanley N. Protigal (57) ABSTRACT

Wetting and print transfer from a printing patterned transfer surface is enhanced by applying an ultraviolet radiation responsive material to the patterned transfer surface. Ultraviolet activation of the ultraviolet responsive coating is performed during a transfer of printing material to a substrate. The technique increases precision of the printing process and is useful for transfer of printing material to a substrate in order to establish printed circuit components such as circuit traces and printed circuit elements on the substrate. In a particular configuration the ultraviolet radiation responsive material can be made of azobenzene material or free radical initiators.

15 Claims, 5 Drawing Sheets

(56) References Cited

U.S. PATENT DOCUMENTS

| | | | |
|---|---|---|---|
| 6,014,929 A * | 1/2000 | Teng | 101/456 |
| 6,096,386 A * | 8/2000 | Biebuyck et al. | 427/510 |
| 6,143,461 A * | 11/2000 | Hsieh et al. | 430/256 |
| 6,884,628 B2 | 4/2005 | Hubbell et al. | |
| 6,951,666 B2 | 10/2005 | Kodas et al. | |
| 7,361,724 B2 | 4/2008 | Guire et al. | |
| 7,368,163 B2 | 5/2008 | Huang et al. | |
| 8,530,539 B2 * | 9/2013 | Miyake et al. | 522/168 |
| 2003/0134931 A1 * | 7/2003 | Chatterjee et al. | 522/178 |
| 2004/0247816 A1 * | 12/2004 | Yamasaki et al. | 428/64.4 |
| 2004/0266207 A1 * | 12/2004 | Sirringhauss et al. | 438/725 |
| 2006/0065138 A1 * | 3/2006 | Tucker et al. | 101/41 |
| 2006/0154179 A1 * | 7/2006 | Van Santen et al. | 430/311 |
| 2006/0226396 A1 * | 10/2006 | Majumdar et al. | 252/500 |
| 2008/0000373 A1 * | 1/2008 | Petrucci-Samija et al. | 101/401.1 |
| 2008/0008957 A1 * | 1/2008 | Munnelly et al. | 430/270.1 |
| 2008/0083484 A1 * | 4/2008 | Blanchet et al. | 156/234 |
| 2008/0311509 A1 * | 12/2008 | Williamson et al. | 430/273.1 |
| 2008/0314271 A1 * | 12/2008 | Goldfarb | 101/401.1 |
| 2010/0155988 A1 * | 6/2010 | Keil et al. | 264/219 |
| 2011/0104389 A1 * | 5/2011 | Bryan-Brown et al. | 427/510 |
| 2012/0141738 A1 * | 6/2012 | Miyake et al. | 428/156 |
| 2014/0145368 A1 * | 5/2014 | Ohashi et al. | 264/234 |

OTHER PUBLICATIONS

Robert C Weast, PhD, editor;CRC Handbook of Chemistry and Physics, 56th edition, CRC press, Cleveland Ohio, 1975 (no month, excerpt p. C-126.*

* cited by examiner

PRINTING USING A STRUCTURE COATED WITH ULTRAVIOLET RADIATION RESPONSIVE MATERIAL

RELATED APPLICATION

The present Patent Application claims priority to Provisional Patent Application No. 61/071,923 filed May 27, 2008, which is filed by the inventors hereof and which incorporated by reference herein.

BACKGROUND

1. Field

The present disclosure generally relates to contact printing, and more specifically to a surface modification of a stamp which assist printing material transfer from stamp to substrate.

2. Background

There are two major ways to lower the cost of electronics devices—increase the packaging efficiency of the integrated circuit (IC) components of the devices, and increase cost effectiveness by using volume production processes. For such a cost-efficient mass production and even more for thin, flexible polymer electronic systems, large area patterning processes may be a choice as an economic production method and will most probably play an important part in polymer electronics manufacturing.

Such electronic devices may include a substrate, printed circuit components such as circuit traces and printed circuit elements such as resistors, and discrete components such as electrodes and other active or passive circuit elements. In many cases, the devices are printed by use of a stamp capable of transferring printing material from the stamp to a substrate in order to establish printed circuit components such as circuit traces and printed circuit elements on the substrate.

High resolution patterning methods for defining the separation between interconnects in electronic devices are important because of the flexibility of the low cost flexible substrate. As simple and efficient as it is, contact printing does nevertheless present some problems, often related to the use of the soft polymer stamp. To ensure high efficiency of transfer of printing material from the stamp, controlling the surface wettability of the stamp is therefore of major interest. FIGS. 1A-D are diagrams showing the ideal a printing procedure of contact printing. During dipping, the printing material should be easily picked up by the stamp, which has a higher surface energy relative to the printing material. While printing on the substrate, the stamp surface should have a lower surface energy relative to the printing material in order to transfer the material to the substrate. To facilitate this material transfer mechanism, control of surface wettability on the stamp surface is a key process.

Stimuli-responsive surfaces make it possible to reversibly control the wettability of the surface and has been demonstrated by various methods, including light-irradiation. Among different controlling methods on surface wettability, light-irradiation is the most effective, especially in large volume production.

U.S. Pat. No. 7,361,724 discloses surface modification by providing a self-assembling monolayer. According to this disclosure, the modified surface cannot be activated by ultraviolet source which is essential to change its properties during the printing process. U.S. Pat. No. 6,951,666 discloses the precursor to modify the surface of a stamp; however, the precursor is limited to conductive features and its application is limited. U.S. Pat. No. 7,368,163 discloses a covalent bonded surface modified on a polymer for printing. According to this disclosure, the absorbed surface modifier is not photosensitive or able to change its state under ultraviolet radiation. U.S. Pat. No. 6,884,628 discloses multifunctional polymeric surface coatings, but its application is limited to sensor devices and the described surface modification cannot be activated by ultraviolet radiation.

SUMMARY

Printing of a pattern having electrical properties is accomplished using a stamp having a patterned transfer surface. The stamp and patterned transfer surface are capable of transfer of printing material from the stamp to a substrate in order to establish printed circuit components such as circuit traces and printed circuit elements on the substrate. An ultraviolet radiation responsive material is applied to the patterned transfer surface in a pattern corresponding to the circuit layout. Printing material is then applied to the patterned transfer surface over the ultraviolet radiation responsive material coating. The stamp is then used to apply the printing material on the patterned surface of a workpiece, and actinic light is used to activate the ultraviolet radiation responsive material.

BRIEF DESCRIPTION OF THE DRAWING

The embodiments disclosed herein are illustrated by examples shown in the following figures but not limited in these figures. These drawings are not necessarily drawn to scale. The disclosure will be described and explained with additional specificity and detail through the use of the accompanying drawings in which.

DETAILED DESCRIPTION

The present disclosure relates to configurations of a stamp structure with ultraviolet radiation responsive material coated thereon and methods for printing by adopting ultraviolet radiation responsive material on stamp and substrate surfaces. Details are set forth to provide a thorough understanding of the configurations described herein with the help of the drawings, but not limited thereto. The features, structures, materials, and characteristics of the technology can be combined in any suitable manner in one or more configurations.

Overview

Ultraviolet irradiation or other actinic light irradiation is applied to a surface which is coated with material sensitive to ultraviolet radiation. The coating should have an in-situ change of chemical structure or surface energy which assists the printing process.

The strategy is based on coating the stamp by ultraviolet radiation responsive material which modifies the stamp such that the printing material can be picked up in a more efficient fashion. During printing, ultraviolet light irradiates the ultraviolet radiation responsive material such that the material changes its chemical structure or chemical configuration which gives a different wetting behavior in contrast to its original state. This change of structure leads to less adhesion between stamp and printing material which leads to the efficient transfer of printing material from stamp to substrate.

The present disclosure provides a low cost and simple process printing solution by using an ultraviolet radiation responsive material on a stamp. The ultraviolet light is used to assist the volume of printing material transferred to and from the stamp. The height of the printed feature can be adjusted by volume picked up and transferred, through quick surface chemistry change on the stamp. This enhances efficient printing material transfer from the stamp to a substrate through ultraviolet irradiation. The residue of printing material can therefore be reduced, while avoiding a need for frequent cleaning or replacing the stamp with a new one. To modify the surface behavior of the stamp to suit different printing materials, the ultraviolet sensitive coating can be formulated according to the different material system. The ultraviolet sensitive coating is applied to the stamp and/or the workpiece, but is exposed to ultraviolet irradiation during the pressing process.

The substrate is the workpiece which is the object to be coated. The substrate may be, by way of non-limiting example, a conductive material for circuitry in electronic packages, semiconductor materials for circuits, a polymer material for building mechanical support or structure in devices, and other circuit devices which can be applied by printing.

In some configurations, the ultraviolet sensitive material is coated only on the surface of the stamp. The printing material can be transferred from stamp to substrate based on its mass and substrate adhesion force after ultraviolet radiation.

In some other configurations, both the stamp and the substrate can be coated by different ultraviolet sensitive material to further increase efficiency of material transfer from the stamp to the substrate.

References throughout this description to "stamp" mean a structure that has relief features or raised impression features which are used for pick up and transfer of printing material to the substrate. The stamp is advantageously transparent to ultraviolet radiation. References throughout this description to "printing material" mean a material transferred to or patterned on a substrate, e.g., a conductive material for circuitry in electronic packages, a polymer material for building mechanical support or structure in devices, etc. References throughout this description to "ultraviolet radiation responsive material" mean a material that is responsive to ultraviolet radiation, such that the material changes its state, chemical structure, chemical configuration or is ablated under ultraviolet radiation. References throughout this description to "substrate" mean a platform for printing material to be printed on. It can be made of any metal, polymer or composite.

U-V Responsive Material

The ultraviolet radiation responsive material is a material responsive to ultraviolet radiation. In one non-limiting example, the ultraviolet responsive material configuration responds to an optical radiation source with less than 400 nm wavelength, such that the material changes its state, chemical structure, chemical configuration or is ablated under ultraviolet radiation. Applying ultraviolet activation of the ultraviolet responsive material causes a reaction of the ultraviolet radiation responsive material. The ultraviolet responsive material may be, by way of non-limiting example, a material which reacts to ultraviolet energy by releasing free radicals. The free radicals infiltrate the printing material or coating material intended for printing, resulting in a reduction in the surface tension of the printing material. The material may be a small molecule organic material which reacts to ultraviolet energy by releasing free radicals, e.g. benzyol peroxide. Other examples of ultraviolet radiation responsive material are ultraviolet-sensitive azobenzene compounds and azobisisobutyronitrile. Suitable materials are responsive to ultraviolet and able to alter its surface energy or morphology to enhance material transfer during printing. The ultraviolet radiation responsive material may be selected so as to be able to form a uniform structure on the stamp. By using ultraviolet activation, it is possible for the stamp behavior to differ before and after application of ultraviolet energy. The actuation is based on the application of ultraviolet light. Prior to ultraviolet activation, the stamp is able to efficiently pick up material during dipping, whereas after ultraviolet activation, the ability of the stamp to release material is enhanced. Thus, during the pressing process, the actuation of the ultraviolet responsive material further facilitates the printing material release.

The printing material is suitable for transfer to or patterned on the substrate which, as indicated above, is the workpiece. The printing material is selected so that it is not directly affected by ultraviolet irradiation. Therefore, the ultraviolet should only affect the ultraviolet reacting material to change its chemical structure or surface energy of the stamp, with the printing material being unaffected by ultraviolet irradiation. The ultraviolet reacting material is tailored according to the printing material chemical composition.

U-V Material Applied to Stamp

Figure 1A:
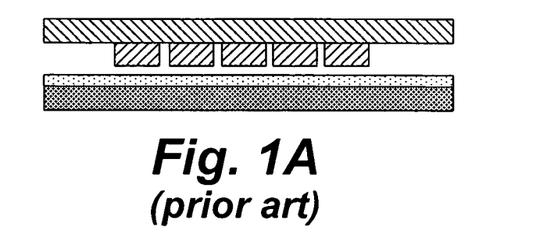
FIGS. 1A-1D (prior art) are schematic cross section side views depicting contact printing.
Figure 1B:
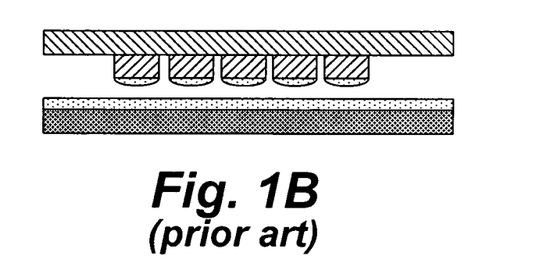
Figure 1C:
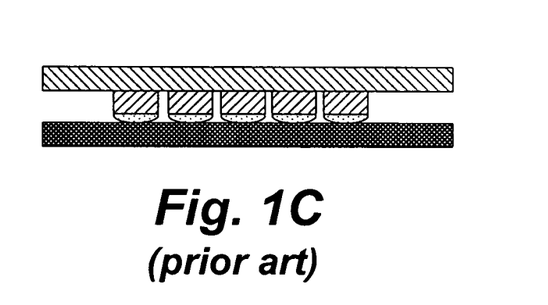
Figure 1D:
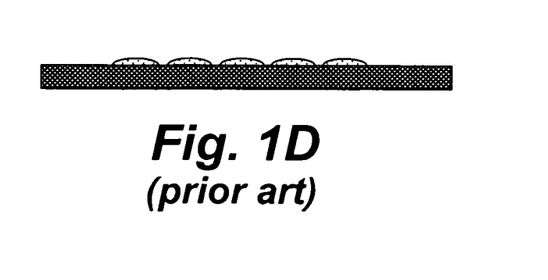
Figure 2A:
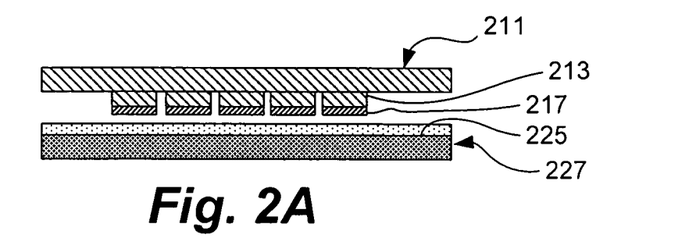
FIGS. 2A-2D are schematic cross section side views depicting printing with a treated stamp.
Figure 2B:
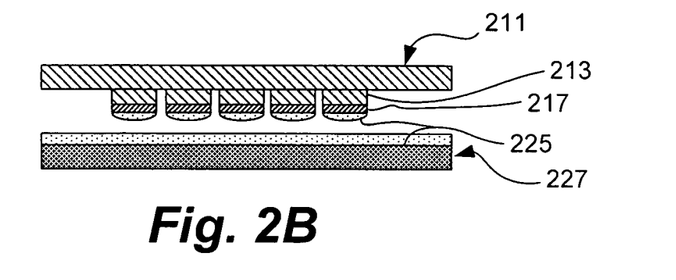
Figure 2C:
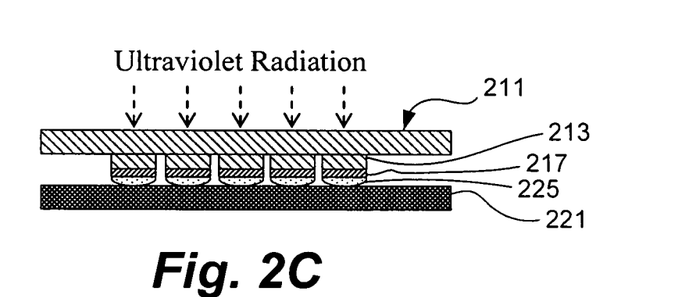
Figure 2D:
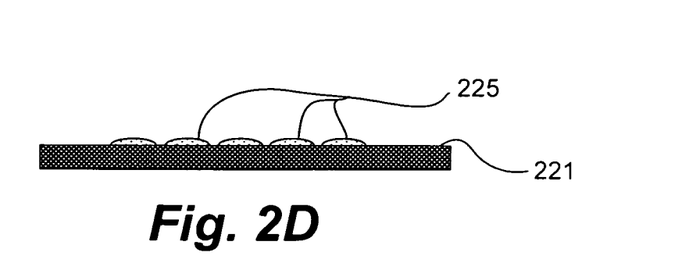

FIGS. 2A-2D are diagrams showing a configuration of printing with a stamp structure 211 which includes relief structure 213 or other patterned surface. The stamp 211 is coated with ultraviolet radiation responsive material 217 for printing onto a substrate 221 (FIGS. 2C and 2D). In this configuration, stamp structure 211 can be made of any material which is transparent to ultraviolet radiation, typically a radiation source of less than 400 nm wavelength. The relief structure 213 of the stamp structure 211 has a height and pitch ranging from submicron to millimeter size (around 1 nm to 1 mm). By way of non-limiting example, the stamp 211 may be made of glass; however other suitable substrates may be used. The glass may be selected as an ultraviolet transparent glass, in order to facilitate ultraviolet activation of the ultraviolet radiation responsive material 217. The substrate 221 is a platform for printing material to be printed on. It can be made by way of non-limiting example, of any metal, polymer or composite, such as epoxy, epoxy composite, polyimide, other plastic resins, ceramics and glass.

The ultraviolet radiation responsive material 217 is the material responsive to ultraviolet radiation, typically a radiation source of less than 400 nm wavelength. The ultraviolet radiation responsive material 217 can be made of free radical initiators or azobenzene materials, which are able to change their state or structure under ultraviolet radiation. The ultraviolet radiation responsive material 217 may be applied in any convenient manner, for example by aerosol application or by dipping into a vessel or pot such as described below in connection with printing material 225.

One feature of the ultraviolet radiation responsive material 217 is that it is responsive to the ultraviolet light so as to be able to change the surface energy of the stamp. In this respect, the surface energy of the ultraviolet radiation responsive material 217 is between the stamp and printing material before application of ultraviolet irradiation, and its surface energy will change to lower than the surface energy of printing material when ultraviolet irradiation is applied.

Free radicals are referred to as atomic or molecular species with unpaired electrons on an otherwise open shell configuration. These unpaired electrons are usually highly reactive, so radicals are likely to take part in chemical reactions. Thus, free radical initiators are highly useful as the ultraviolet radiation responsive material 217. The ultraviolet radiation responsive material 217 is able to form a uniform structure on stamp 211 through different coating and deposition methods. The ultraviolet radiation responsive material 217 should have the ability to change the surface energy of the stamp 211.

Turning now to FIG. 2A, the stamp 211 is first dipped into a vessel of printing material 225 inside a vessel 227 under pressure. The pressure is less than yield point of stamp 211. The time of dipping is not limited, but may be less than one minute. The printing material 225 is then picked up when stamp 211 is lifted up (FIG. 2B) and the stamp 211 is stamped on to substrate 221 under pressure which is less than yield point of stamp 211 (FIG. 2C). The stamping time is not limited, but may be less than one minute. During stamping, an ultraviolet source having a wavelength less than 400 nm is applied on top of the stamp and activates the ultraviolet radiation responsive material 217. The change of state or change of structure of ultraviolet radiation responsive material 217 results in a change of the wetting properties of the printing material 225. The time for applying the ultraviolet radiation is not limited but may be long enough to change the state or structure of ultraviolet radiation responsive material 217. The change the state or structure of ultraviolet radiation responsive material 217 should decrease the wetting of printing material 225 on stamp 211 which helps with the transfer of the printing material 225 to substrate 221. After stamping, the stamp 211 is lifted up and the printing material 225 is transferred on to the substrate 221 with desired geometry (FIG. 2D).

The ultraviolet radiation responsive material 217 can be applied before each printing cycle, or can be reused. By way of non-limiting example, the ultraviolet radiation responsive material is reusable more than 10 printing cycles.

U-V Material on Stamp and Substrate

FIGS. 3A-3D are diagrams showing a configuration of printing with inventive stamp structure 311 which includes relief structure 313 or other patterned surface. The stamp 311 is coated with ultraviolet radiation responsive material 317 and substrate 321 is coated with another type of ultraviolet radiation responsive material 323. In this configuration, stamp structure 311 can be made of any material which is transparent to ultraviolet radiation, typically a radiation source of less than 400 nm wavelength. The relief structure 313 of the stamp structure 311 has the height and pitch ranging from submicron to millimeter size (around 1 nm to 1 mm). The ultraviolet radiation responsive material 317 is the material responsive to ultraviolet radiation, typically a radiation source of less than 400 nm wavelength. In a non-limiting example, the ultraviolet radiation responsive material 317 and substrate 321 is made of free radical initiators or azobenzene materials, which are able to change their state or structure under ultraviolet radiation. Other than the use of the other type of ultraviolet radiation responsive material 323, the materials and structure are similar to that described in connection with FIGS. 2A-2D.

The ultraviolet radiation responsive material 317 is able to form a uniform structure on stamp 311 through different coating and deposition methods. Examples of coating methods include spin-coating, dip-coating and other ultraviolet radiation responsive material deposition methods. The ultraviolet radiation responsive materials 317 and 323 should have the ability to change the surface energy of the stamp 311 and substrate 321, respectively.

Figure 3A:
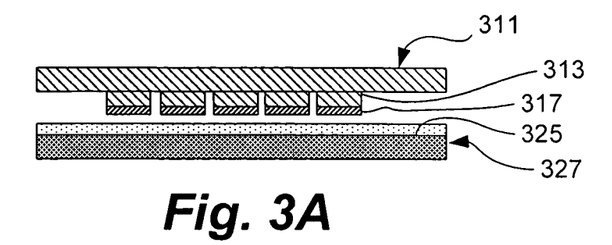
FIGS. 3A-3D are schematic cross section side views depicting printing with a treated stamp and a treated substrate.
Figure 3B:
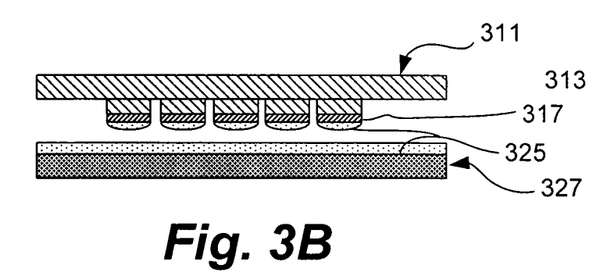
Figure 3C:
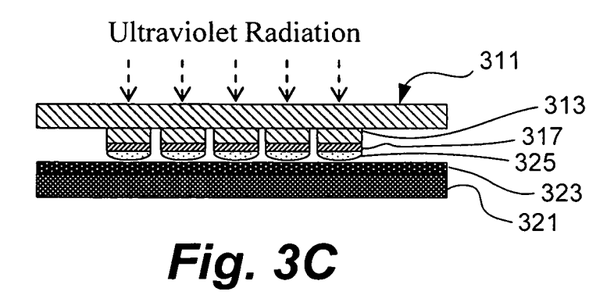
Figure 3D:
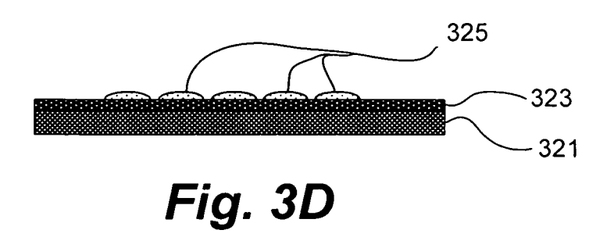

Turning now to FIG. 3A, the stamp 311 is first dipped into a vessel of printing material 325 inside a vessel 327 under pressure which is less than yield point of stamp 311. The time of dipping is not limited but may be less than one minute. The printing material 325 is then picked up when stamp 311 is lifted up (FIG. 3B) and the stamp 311 is stamped on to substrate 321 under pressure which is less than yield point of stamp 311 (FIG. 3C). The stamping time is not limited but may be less than one minute. During stamping, an ultraviolet source with its wavelength less than 400 nm is shined on top of the stamp 311 and activates the ultraviolet radiation responsive material 317 on the stamp 311 and the ultraviolet radiation responsive material 323 on substrate 321. The change of state or change of structure of ultraviolet radiation responsive material 317 and 321 then changes its wetting properties with printing material 325. The time for ultraviolet radiation is not limited but is long enough to change the state or structure of ultraviolet radiation responsive material 317. The change in the state or structure of ultraviolet radiation responsive material 317 decreases the wetting of printing material 325 on stamp 311 and increase the wetting of printing material 325 on substrate 321, which helps with the transfer of the printing material 325 to substrate 321. After stamping, the stamp 311 is lifted up and the printing material 325 is transferred on to the substrate 321 with desired geometry (FIG. 3D).

Functional Operation

Figure 4:
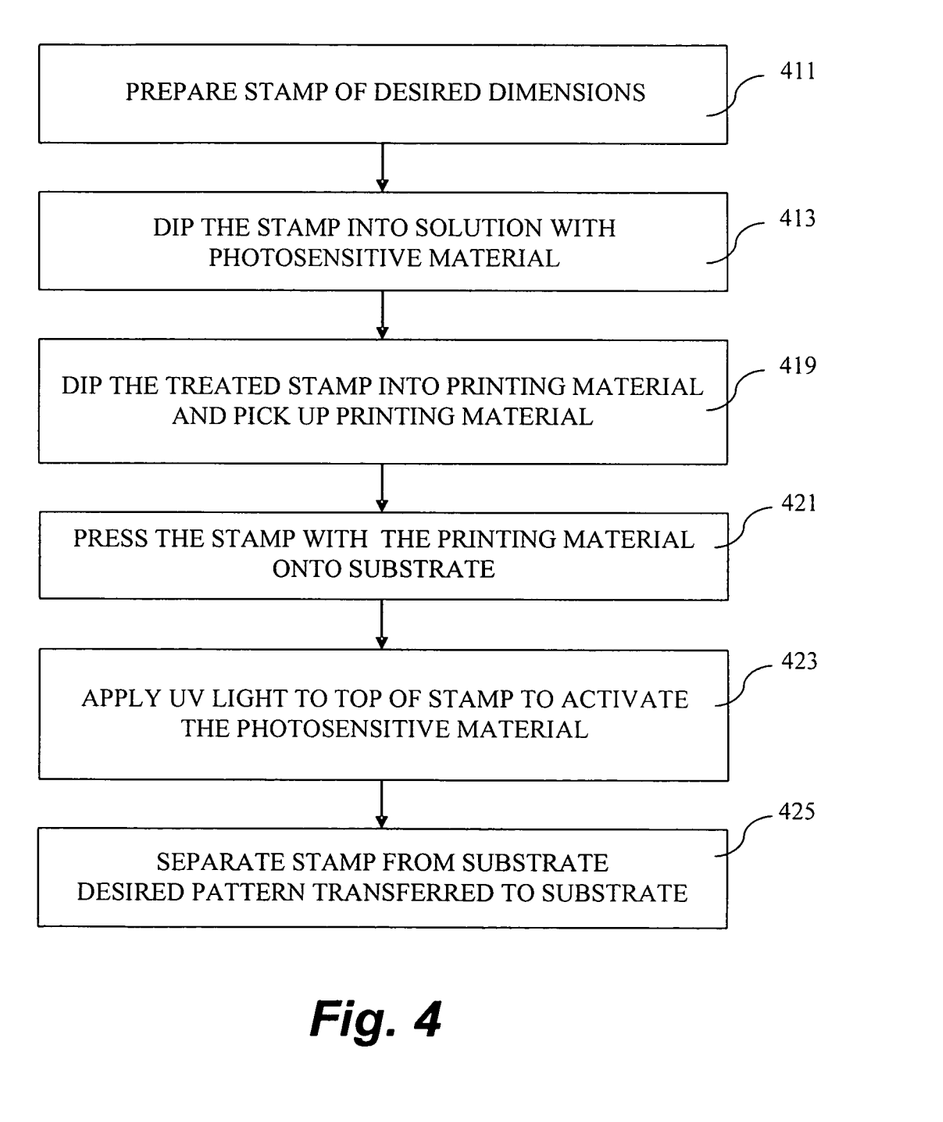
FIG. 4 is a schematic flowchart for a printing process with a treated stamp.

FIG. 4 is a schematic flowchart for a printing process with a treated stamp in accordance with the present subject matter. A stamp is prepared of desired dimensions (step 411). The stamp is first dipped into a solution of photosensitive material, such as an ultraviolet responsive material (step 413). The stamp, treated with the ultraviolet radiation responsive material is dipped (step 419) into a pot containing printing material. This causes the stamp to pick up printing material from the vessel. The stamp with the printing material is then pressed onto a substrate (step 421). While in contact with the substrate, ultraviolet light or other energy used to activate the ultraviolet responsive material which is applied to the top of stamp (step 423), resulting in activation of the ultraviolet radiation responsive material. The stamp is then separated from the substrate (step 425), resulting in the desired pattern being transferred to the substrate.

Figure 5:
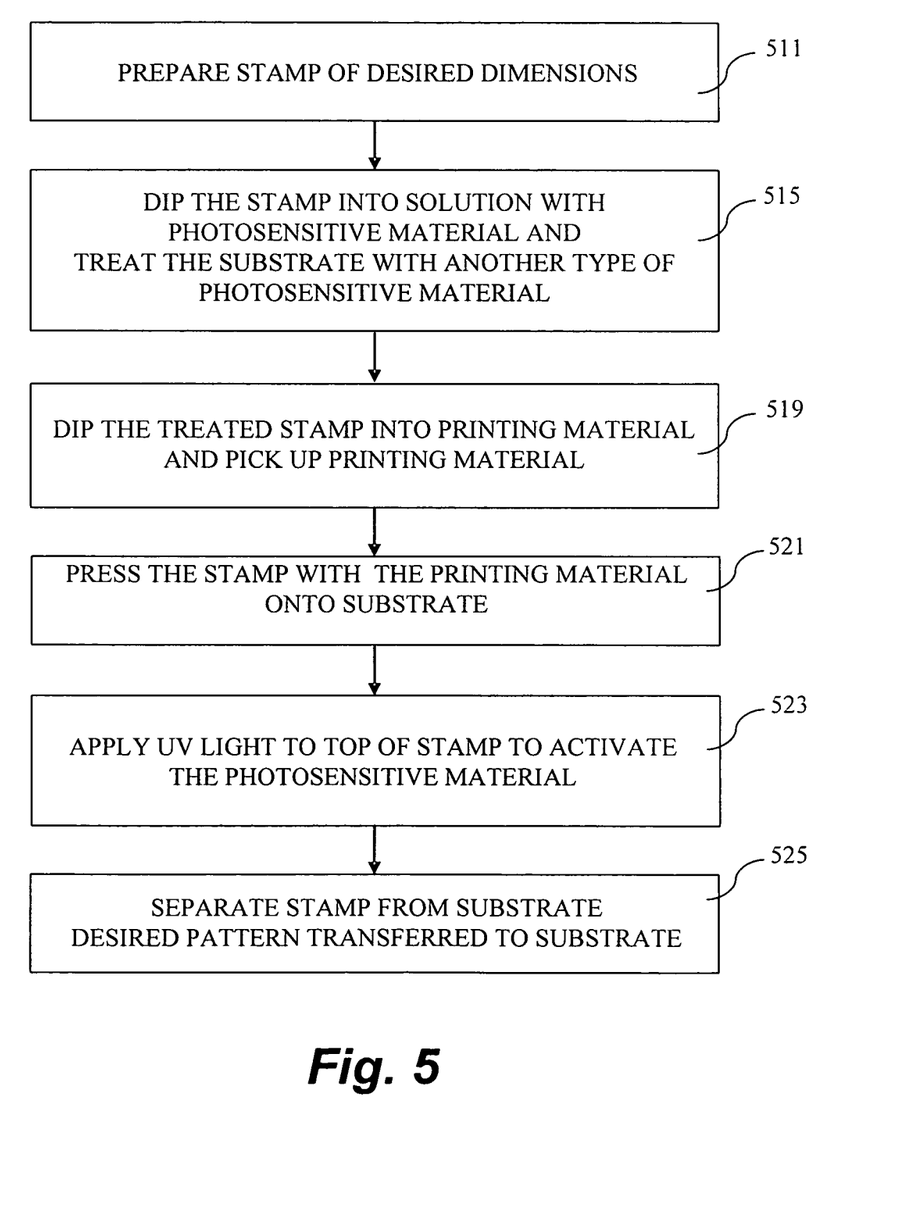
FIG. 5 is a schematic flowchart for a printing process with a treated stamp and treated substrate.

FIG. 5 is a schematic flowchart for a printing process with a treated stamp and treated substrate in accordance with the present subject matter. A stamp is prepared of desired dimensions (step 511). The stamp is first dipped into a solution of ultraviolet radiation responsive material, (step 515). At the same time, the surface of the substrate is treated with the same or a different type of ultraviolet responsive material. The stamp, treated with the ultraviolet responsive material, is then dipped (step 519) into a pot containing printing material. This causes the stamp to pick up printing material from the vessel. The stamp with the printing material is then pressed onto substrate (step 521). While in contact with the substrate, ultraviolet light or other energy used to activate the ultraviolet responsive material is applied to the top of stamp (step 523), resulting in activation of the ultraviolet responsive material.

The stamp is then separated from the substrate (step 525), resulting in the desired pattern being transferred to the substrate.

CONCLUSION

It will be understood that many additional changes in the details, materials, steps and arrangement of parts, which have been herein described and illustrated to explain the nature of the subject matter, may be made by those skilled in the art within the principle and scope of the invention as expressed in the appended claims. By way of example, the specific configuration of the stamp (e.g, stamp 211 depicted in FIG. 2) can vary in accordance with a specific manufacturing technique. Variations can include the use of a raised structure instead of a relief structure in order to create a desired transfer surface on the stamp. Therefore, it will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A method comprised of:
   providing a stamp having a patterned transfer surface;
   applying an ultraviolet radiation responsive material to the patterned transfer surface;
   applying a printing material to the patterned transfer surface over the patterned transfer surface;
   applying ultraviolet activation of the ultraviolet responsive material so as to cause a reaction of the ultraviolet radiation responsive material and expose the printing material to free radicals released from the radiation responsive material in response to the ultraviolet application, wherein the free radicals infiltrate the printing material; and
   applying the stamp to a work surface to effect a transfer of printing material to a substrate;
   after effecting transfer of the printing material to the substrate, repeating the sequence of applying the ultraviolet radiation responsive material to the patterned transfer surface, applying the printed material to the patterned transfer surface and applying the ultraviolet activation, and then applying the stamp to a subsequent work surface to effect a subsequent transfer of printing material; or repeating the alternative sequence of applying the printed material to the patterned transfer surface and applying the ultraviolet activation, and then applying the stamp to a subsequent work surface to effect a subsequent transfer of printing material.

2. The method of claim 1, further comprising applying the printing material by dipping the stamp into a vessel containing the printing material.

3. The method of claim 1, further comprising:
   applying the ultraviolet radiation responsive material by dipping the stamp into a vessel containing the ultraviolet radiation responsive material; and
   applying the printing material by dipping the stamp into a vessel containing the printing material.

4. The method of claim 1, further comprising applying the ultraviolet activation by transmitting ultraviolet radiation through a transparent portion of the stamp.

5. The method as set forth in claim 1, wherein the stamp comprises:
   the patterned transfer surface providing a capability of transferring the printing material from the stamp to the substrate in order to establish printed circuit components such as circuit traces and printed circuit elements on the substrate.

6. The method as set forth in claim 1, further comprising:
   dipping the stamp to pick up the printing material; and
   subsequent to picking up the printing material, applying the ultraviolet activation.

7. The method as set forth in claim 1, further comprising:
   dipping the stamp to pick up the printing material;
   applying the printing material to the work surface; and
   applying the ultraviolet activation prior to or during application of the printing material to the work surface.

8. The method as set forth in claim 1, wherein the ultraviolet activation of the ultraviolet responsive material results in a change of state or structure of the ultraviolet radiation responsive material under ultraviolet radiation during transfer of printing material to the substrate.

9. The method of claim 8, comprising:
   providing, as the ultraviolet responsive material, a material responsive to a radiation source,
   wherein the ultraviolet responsive material has a property of changing its state or structure under the ultraviolet radiation, from the radiation source of less than 400 nm wavelength.

10. The method of claim 8, wherein the ultraviolet responsive material comprises at least one free radical initiator or azobenzene material.

11. The method of claim 8, wherein the ultraviolet responsive material comprises at least one free radical initiator, comprised of at least one organic material.

12. The method of claim 8, wherein the ultraviolet radiation responsive material provides a change in the surface energy of the stamp by establishing a lower surface energy between the printing material and the stamp during the ultraviolet radiation.

13. The method of claim 8, wherein the ultraviolet responsive material comprises at least one of free radical initiators, azobenzene material, and a material selected from at least one of the group consisting of azobisisobutyronitrile and benzyol peroxide.

14. The method of claim 8, wherein the activation of the ultraviolet responsive material by application of the ultraviolet radiation results in formation of a structure on the substrate.

15. The method of claim 8, wherein:
   the ultraviolet radiation responsive material has a capability of changing its state or structure under ultraviolet radiation; and
   the activation of the ultraviolet responsive material results in a change of the surface energy of the substrate by establishing a lower surface energy between the substrate and the printing material.

* * * * *